(12) United States Patent
Koottungal

(10) Patent No.: US 8,089,473 B2
(45) Date of Patent: Jan. 3, 2012

(54) TOUCH SENSOR

(75) Inventor: Paul D. Koottungal, Indianapolis, IN (US)

(73) Assignee: Masco Corporation of Indiana, Indianapolis, IN (US)

( * ) Notice: Subject to any disclaimer, the term of this patent is extended or adjusted under 35 U.S.C. 154(b) by 1038 days.

(21) Appl. No.: 11/734,499

(22) Filed: Apr. 12, 2007

(65) Prior Publication Data

US 2007/0246267 A1 Oct. 25, 2007

Related U.S. Application Data

(60) Provisional application No. 60/793,885, filed on Apr. 20, 2006.

(51) Int. Cl.
*G06F 3/044* (2006.01)

(52) U.S. Cl. ............ 345/173; 137/801; 178/18.06; 251/129.03; 251/129.04

(58) Field of Classification Search .......... 345/169, 345/173; 701/2; 210/282; 360/97.02; 4/623
See application file for complete search history.

(56) References Cited

U.S. PATENT DOCUMENTS

| | | | |
|---|---|---|---|
| 2,337,321 A | 12/1943 | Freeman |
| 2,991,481 A | 7/1961 | Book |
| 3,081,594 A | 3/1963 | Atkins et al. |
| 3,151,340 A | 10/1964 | Teshima |
| 3,254,313 A | 5/1966 | Atkins et al. |
| 3,314,081 A | 4/1967 | Atkins et al. |
| 3,406,941 A | 10/1968 | Ichimori et al. |
| 3,588,038 A | 6/1971 | Tanaka |
| 3,651,989 A | 3/1972 | Westrich |
| 3,672,479 A | 6/1972 | Schwertfeger et al. |
| 3,685,541 A | 8/1972 | Caparone et al. |
| 3,705,574 A | 12/1972 | Duncan |
| 3,756,456 A | 9/1973 | Georgi |
| 3,762,440 A | 10/1973 | Bryant |
| 3,799,171 A | 3/1974 | Patel |
| 3,987,819 A | 10/1976 | Scheuermann |
| 4,172,381 A | 10/1979 | Aigner |
| 4,185,336 A | 1/1980 | Young |
| 4,200,018 A * | 4/1980 | Sekiwa ............... 83/425 |
| 4,201,518 A | 5/1980 | Stevenson |
| 4,280,530 A | 7/1981 | Yi |
| 4,331,292 A | 5/1982 | Zimmer |
| 4,337,388 A | 6/1982 | July |
| 4,359,186 A | 11/1982 | Kiendl |
| 4,406,313 A | 9/1983 | Bennett et al. |
| 4,407,444 A | 10/1983 | Knebel et al. |

(Continued)

FOREIGN PATENT DOCUMENTS

CA 2492226 A1 7/2005

(Continued)

OTHER PUBLICATIONS

ZURN® Plumbing Products Group, "AquaSense® Z6903 Series", Installation, Operation, Maintenance and Parts Manual, Aug. 2001, 5 pgs.

(Continued)

*Primary Examiner* — Amare Mengistu
*Assistant Examiner* — Jennifer Zubajlo
(74) *Attorney, Agent, or Firm* — Baker & Daniels LLP

(57) ABSTRACT

A sensor is disclosed. The sensor may be a touch sensor. The sensor may be incorporated into a water delivery system.

27 Claims, 4 Drawing Sheets

U.S. PATENT DOCUMENTS

| | | |
|---|---|---|
| 4,409,694 A | 10/1983 | Barrett et al. |
| 4,410,791 A | 10/1983 | Eastep |
| 4,420,811 A | 12/1983 | Tarnay et al. |
| 4,421,269 A | 12/1983 | Ts'ao |
| 4,424,767 A | 1/1984 | Wicke et al. |
| 4,429,422 A | 2/1984 | Wareham |
| 4,436,983 A | 3/1984 | Solobay |
| 4,439,669 A | 3/1984 | Ryffel |
| 4,450,829 A | 5/1984 | Morita et al. |
| 4,459,465 A | 7/1984 | Knight |
| 4,503,575 A | 3/1985 | Knoop et al. |
| 4,532,962 A | 8/1985 | Campau |
| 4,537,348 A | 8/1985 | Gossi |
| 4,541,562 A | 9/1985 | Zukausky |
| 4,554,688 A | 11/1985 | Puccerella |
| 4,563,780 A | 1/1986 | Pollack |
| 4,567,350 A | 1/1986 | Todd, Jr. |
| 4,581,707 A | 4/1986 | Millar |
| 4,584,463 A | 4/1986 | Klages et al. |
| 4,604,515 A | 8/1986 | Davidson |
| 4,604,764 A | 8/1986 | Enzo |
| 4,606,325 A | 8/1986 | Lujan |
| 4,611,757 A | 9/1986 | Saether |
| 4,628,902 A | 12/1986 | Comber |
| 4,638,147 A | 1/1987 | Dytch et al. |
| 4,674,678 A | 6/1987 | Knebel et al. |
| 4,680,446 A | 7/1987 | Post |
| 4,682,581 A | 7/1987 | Laing et al. |
| 4,682,728 A | 7/1987 | Oudenhoven et al. |
| 4,688,277 A | 8/1987 | Kakinoki et al. |
| 4,693,415 A | 9/1987 | Sturm |
| 4,700,884 A | 10/1987 | Barrett et al. |
| 4,700,885 A | 10/1987 | Knebel |
| 4,709,728 A | 12/1987 | Ying-Chung |
| 4,713,525 A | 12/1987 | Eastep |
| 4,735,357 A | 4/1988 | Gregory et al. |
| 4,738,280 A | 4/1988 | Oberholtzer |
| 4,742,456 A | 5/1988 | Kamena |
| 4,750,472 A | 6/1988 | Fazekas |
| 4,753,265 A | 6/1988 | Barrett et al. |
| 4,756,030 A | 7/1988 | Juliver |
| 4,757,943 A | 7/1988 | Sperling et al. |
| 4,762,273 A | 8/1988 | Gregory et al. |
| 4,768,705 A | 9/1988 | Tsutsui et al. |
| 4,786,782 A | 11/1988 | Takai et al. |
| 4,798,224 A | 1/1989 | Haws |
| 4,808,793 A | 2/1989 | Hurko |
| 4,832,259 A | 5/1989 | Vandermeyden |
| 4,854,498 A | 8/1989 | Stayton |
| 4,869,287 A | 9/1989 | Pepper et al. |
| 4,869,427 A | 9/1989 | Kawamoto et al. |
| 4,870,986 A | 10/1989 | Barrett et al. |
| 4,872,485 A | 10/1989 | Laverty |
| 4,875,623 A | 10/1989 | Garris |
| 4,893,653 A | 1/1990 | Ferrigno |
| 4,896,658 A | 1/1990 | Yonekubo et al. |
| 4,901,915 A | 2/1990 | Sakakibara |
| 4,909,435 A | 3/1990 | Kidouchi et al. |
| 4,914,758 A | 4/1990 | Shaw |
| 4,916,613 A | 4/1990 | Lange et al. |
| 4,917,142 A | 4/1990 | Laing et al. |
| 4,923,116 A | 5/1990 | Homan |
| 4,930,551 A | 6/1990 | Haws |
| 4,936,289 A | 6/1990 | Peterson |
| 4,936,508 A | 6/1990 | Ingalz |
| 4,941,608 A | 7/1990 | Shimizu et al. |
| 4,945,942 A | 8/1990 | Lund |
| 4,945,943 A | 8/1990 | Cogger |
| 4,955,535 A | 9/1990 | Tsutsui et al. |
| 4,965,894 A | 10/1990 | Baus |
| 4,967,794 A | 11/1990 | Tsutsui et al. |
| 4,969,598 A | 11/1990 | Garris |
| 4,970,373 A | 11/1990 | Lutz et al. |
| 4,971,106 A | 11/1990 | Tsutsui et al. |
| 4,998,673 A | 3/1991 | Pilolla |
| 5,009,572 A | 4/1991 | Imhoff et al. |
| 5,020,127 A | 5/1991 | Eddas et al. |
| 5,033,508 A | 7/1991 | Laverty |
| 5,033,715 A | 7/1991 | Chiang |
| 5,040,106 A | 8/1991 | Maag |
| 5,042,524 A | 8/1991 | Lund |
| 5,056,712 A | 10/1991 | Enck |
| 5,057,214 A | 10/1991 | Morris |
| 5,058,804 A | 10/1991 | Yonekubo et al. |
| 5,063,955 A | 11/1991 | Sakakibara |
| 5,073,991 A | 12/1991 | Marty |
| 5,074,520 A | 12/1991 | Lee et al. |
| 5,086,526 A | 2/1992 | Van Marcke |
| 5,092,560 A | 3/1992 | Chen |
| 5,095,945 A | 3/1992 | Jensen |
| 5,105,846 A | 4/1992 | Britt |
| 5,124,934 A | 6/1992 | Kawamoto et al. |
| 5,125,433 A | 6/1992 | DeMoss et al. |
| 5,129,034 A | 7/1992 | Sydenstricker |
| 5,133,089 A | 7/1992 | Tsutsui et al. |
| 5,139,044 A | 8/1992 | Otten et al. |
| 5,143,049 A | 9/1992 | Laing et al. |
| 5,148,824 A | 9/1992 | Wilson et al. |
| 5,170,361 A | 12/1992 | Reed |
| 5,170,514 A | 12/1992 | Weigert |
| 5,170,816 A | 12/1992 | Schnieders |
| 5,170,944 A | 12/1992 | Shirai |
| 5,174,495 A | 12/1992 | Eichholz et al. |
| 5,175,892 A | 1/1993 | Shaw |
| 5,183,029 A | 2/1993 | Ranger |
| 5,184,642 A | 2/1993 | Powell |
| 5,187,816 A | 2/1993 | Chiou |
| 5,202,666 A | 4/1993 | Knippscheer |
| 5,205,318 A | 4/1993 | Massaro et al. |
| 5,206,963 A | 5/1993 | Wiens |
| 5,217,035 A | 6/1993 | Van Marcke |
| 5,224,509 A | 7/1993 | Tanaka et al. |
| 5,224,685 A | 7/1993 | Chiang et al. |
| 5,226,629 A | 7/1993 | Millman et al. |
| 5,243,717 A | 9/1993 | Yasuo |
| D340,279 S | 10/1993 | Mattis |
| 5,257,341 A | 10/1993 | Austin et al. |
| 5,261,443 A | 11/1993 | Walsh |
| 5,262,621 A | 11/1993 | Hu et al. |
| 5,265,318 A | 11/1993 | Shero |
| 5,277,219 A | 1/1994 | Lund |
| 5,287,570 A | 2/1994 | Peterson et al. |
| 5,315,719 A | 5/1994 | Tsutsui et al. |
| 5,323,803 A | 6/1994 | Blumenauer |
| 5,325,822 A | 7/1994 | Fernandez |
| 5,334,819 A | 8/1994 | Lin |
| 5,341,839 A | 8/1994 | Kobayashi et al. |
| 5,351,712 A | 10/1994 | Houlihan |
| 5,358,177 A | 10/1994 | Cashmore |
| 5,361,215 A | 11/1994 | Tompkins et al. |
| 5,362,026 A | 11/1994 | Kobayashi et al. |
| 5,385,168 A | 1/1995 | Lund |
| 5,400,961 A | 3/1995 | Tsutsui et al. |
| 5,408,578 A | 4/1995 | Bolivar |
| 5,409,037 A | 4/1995 | Wheeler et al. |
| 5,419,930 A | 5/1995 | Schucker |
| 5,429,272 A | 7/1995 | Luigi |
| 5,431,302 A | 7/1995 | Tulley et al. |
| 5,433,342 A | 7/1995 | Luro |
| 5,437,003 A | 7/1995 | Blanco |
| RE35,018 E | 8/1995 | Homan |
| 5,438,642 A | 8/1995 | Posen |
| 5,467,967 A | 11/1995 | Gillooly |
| 5,479,558 A | 12/1995 | White et al. |
| 5,482,250 A | 1/1996 | Kodaira |
| 5,504,306 A | 4/1996 | Russell et al. |
| 5,504,950 A | 4/1996 | Natalizia et al. |
| 5,511,579 A | 4/1996 | Price |
| 5,511,723 A | 4/1996 | Eki et al. |
| 5,540,555 A | 7/1996 | Corso et al. |
| 5,550,753 A | 8/1996 | Tompkins et al. |
| 5,555,912 A | 9/1996 | Saadi et al. |
| 5,564,462 A | 10/1996 | Storch |
| 5,566,702 A | 10/1996 | Philipp |
| 5,570,869 A | 11/1996 | Diaz et al. |
| 5,572,985 A | 11/1996 | Benham |
| 5,575,424 A | 11/1996 | Fleischmann |

| | | | | | | |
|---|---|---|---|---|---|---|
| 5,577,660 A | 11/1996 | Hansen | | 6,321,785 B1 | 11/2001 | Bergmann |
| 5,584,316 A | 12/1996 | Lund | | 6,337,635 B1 | 1/2002 | Ericksen et al. |
| 5,586,572 A | 12/1996 | Lund | | 6,340,032 B1 | 1/2002 | Zosimadis |
| 5,588,636 A | 12/1996 | Eichholz et al. | | 6,341,389 B2 | 1/2002 | Philipps-Liebich et al. |
| 5,595,342 A | 1/1997 | McNair et al. | | 6,351,603 B2 | 2/2002 | Waithe et al. |
| 5,603,344 A | 2/1997 | Hall | | 6,363,549 B2 | 4/2002 | Humpert et al. |
| 5,610,589 A | 3/1997 | Evans et al. | | 6,377,009 B1 | 4/2002 | Philipp |
| 5,622,203 A | 4/1997 | Givler et al. | | 6,381,770 B1 | 5/2002 | Raisch |
| 5,623,990 A | 4/1997 | Pirkle | | 6,389,226 B1 | 5/2002 | Neale et al. |
| 5,627,375 A | 5/1997 | Hsieh | | 6,438,770 B1 | 8/2002 | Hed et al. |
| 5,634,220 A | 6/1997 | Chiu | | 6,445,306 B1 | 9/2002 | Trovato et al. |
| 5,682,032 A | 10/1997 | Philipp | | 6,446,875 B1 | 9/2002 | Brooks et al. |
| 5,694,653 A | 12/1997 | Harald | | 6,452,514 B1 | 9/2002 | Philipp |
| 5,730,165 A | 3/1998 | Philipp | | RE37,888 E | 10/2002 | Cretu-Petra |
| 5,735,291 A | 4/1998 | Kaonohi | | 6,457,355 B1 | 10/2002 | Philipp |
| 5,758,688 A | 6/1998 | Hamanaka et al. | | 6,466,036 B1 | 10/2002 | Philipp |
| 5,769,120 A | 6/1998 | Laverty et al. | | 6,473,917 B1 | 11/2002 | Mateina |
| 5,775,372 A | 7/1998 | Houlihan | | 6,474,951 B2 | 11/2002 | Stephan et al. |
| 5,784,531 A | 7/1998 | Mann et al. | | 6,513,787 B1 | 2/2003 | Jeromson et al. |
| 5,790,024 A | 8/1998 | Ripingill et al. | | 6,522,078 B1 | 2/2003 | Okamoto et al. |
| 5,812,059 A | 9/1998 | Shaw et al. | | 6,535,200 B2 | 3/2003 | Philipp |
| 5,813,655 A | 9/1998 | Pinchott et al. | | 6,536,464 B1 | 3/2003 | Lum et al. |
| 5,819,366 A | 10/1998 | Edin | | 6,549,816 B2 | 4/2003 | Gauthier et al. |
| 5,823,229 A | 10/1998 | Bertrand et al. | | 6,574,426 B1 | 6/2003 | Blanco, Jr. |
| 5,829,467 A | 11/1998 | Spicher | | 6,588,377 B1 | 7/2003 | Leary et al. |
| 5,829,475 A | 11/1998 | Acker | | 6,588,453 B2 | 7/2003 | Marty et al. |
| 5,845,844 A | 12/1998 | Zosimodis | | 6,598,245 B2 | 7/2003 | Nishioka |
| 5,853,130 A | 12/1998 | Ellsworth | | 6,612,267 B1 | 9/2003 | West |
| 5,855,356 A | 1/1999 | Fait | | 6,619,320 B2 | 9/2003 | Parsons |
| 5,857,717 A | 1/1999 | Caffrey | | 6,622,930 B2 | 9/2003 | Laing et al. |
| 5,868,311 A | 2/1999 | Cretu-Petra | | 6,629,645 B2 | 10/2003 | Mountford et al. |
| 5,872,891 A | 2/1999 | Son | | 6,639,209 B1 | 10/2003 | Patterson et al. |
| 5,893,387 A | 4/1999 | Paterson et al. | | 6,644,333 B2 | 11/2003 | Gloodt |
| 5,918,855 A | 7/1999 | Hamanaka et al. | | 6,659,048 B1 | 12/2003 | DeSantis et al. |
| 5,934,325 A | 8/1999 | Brattoli et al. | | 6,676,024 B1 | 1/2004 | McNerney et al. |
| 5,941,275 A | 8/1999 | Laing | | 6,684,822 B1 | 2/2004 | Lieggi |
| 5,944,221 A | 8/1999 | Laing et al. | | 6,691,338 B2 | 2/2004 | Zieger |
| 5,961,095 A | 10/1999 | Schrott | | 6,705,534 B1 | 3/2004 | Mueller |
| 5,963,624 A | 10/1999 | Pope | | 6,707,030 B1 | 3/2004 | Watson |
| 5,966,753 A | 10/1999 | Gauthier et al. | | 6,734,685 B2 | 5/2004 | Rudrich |
| 5,979,776 A | 11/1999 | Williams | | 6,738,996 B1 | 5/2004 | Malek et al. |
| 5,983,922 A | 11/1999 | Laing et al. | | 6,757,921 B2 | 7/2004 | Esche |
| 6,000,170 A | 12/1999 | Davis | | 6,768,103 B2 | 7/2004 | Watson |
| 6,003,170 A | 12/1999 | Humpert et al. | | 6,770,869 B2 | 8/2004 | Patterson et al. |
| 6,003,182 A | 12/1999 | Song | | 6,779,552 B1 | 8/2004 | Coffman |
| 6,006,784 A | 12/1999 | Tsutsui et al. | | 6,845,526 B2 | 1/2005 | Malek et al. |
| 6,019,130 A | 2/2000 | Rump | | 6,892,952 B2 | 5/2005 | Chang et al. |
| 6,026,844 A | 2/2000 | Laing et al. | | 6,895,985 B2 | 5/2005 | Popper et al. |
| 6,029,094 A | 2/2000 | Diffut | | 6,913,203 B2 | 7/2005 | DeLangis |
| 6,032,616 A | 3/2000 | Jones | | 6,955,333 B2 | 10/2005 | Patterson et al. |
| 6,042,885 A | 3/2000 | Woollard et al. | | 6,956,498 B1 | 10/2005 | Gauthier et al. |
| 6,059,192 A | 5/2000 | Zosimadis | | 6,962,162 B2 | 11/2005 | Acker |
| 6,061,499 A | 5/2000 | Hlebovy | | 6,962,168 B2 | 11/2005 | McDaniel et al. |
| 6,075,454 A | 6/2000 | Yamasaki | | 6,964,404 B2 | 11/2005 | Patterson et al. |
| 6,082,407 A | 7/2000 | Paterson et al. | | 6,964,405 B2 | 11/2005 | Marcichow et al. |
| 6,093,131 A | 7/2000 | Rohs | | 6,968,860 B1 | 11/2005 | Haenlein et al. |
| 6,093,313 A | 7/2000 | Bovaird et al. | | 6,993,607 B2 | 1/2006 | Philipp |
| 6,101,452 A | 8/2000 | Krall et al. | | 7,025,077 B2 | 4/2006 | Vogel |
| 6,132,085 A | 10/2000 | Bergeron | | 7,069,941 B2 | 7/2006 | Parsons et al. |
| 6,167,845 B1 | 1/2001 | Decker, Sr. | | 7,096,517 B2 | 8/2006 | Gubeli et al. |
| 6,175,689 B1 | 1/2001 | Blanco, Jr. | | 7,099,649 B2 | 8/2006 | Patterson et al. |
| 6,182,683 B1 | 2/2001 | Sisk | | D528,991 S | 9/2006 | Katsuyama |
| 6,192,192 B1 | 2/2001 | Illy et al. | | 7,150,293 B2 | 12/2006 | Jonte |
| 6,196,065 B1 | 3/2001 | Henksmeier et al. | | 7,174,577 B2 | 2/2007 | Jost et al. |
| 6,202,980 B1 | 3/2001 | Vincent et al. | | 7,232,111 B2 | 6/2007 | McDaniel et al. |
| 6,227,235 B1 | 5/2001 | Laing et al. | | 7,295,190 B2 | 11/2007 | Philipp |
| 6,240,250 B1 | 5/2001 | Blanco, Jr. | | 7,537,195 B2 | 5/2009 | McDaniel et al. |
| 6,250,558 B1 | 6/2001 | Dogre Cuevas | | 7,690,395 B2 | 4/2010 | Jonte et al. |
| 6,250,601 B1 | 6/2001 | Kolar et al. | | 2001/0022352 A1 | 9/2001 | Rudrich |
| 6,273,394 B1 | 8/2001 | Vincent et al. | | 2002/0007510 A1 | 1/2002 | Mann |
| 6,283,139 B1 | 9/2001 | Symonds et al. | | 2002/0015024 A1* | 2/2002 | Westerman et al. .......... 345/173 |
| 6,286,764 B1 | 9/2001 | Garvey et al. | | 2002/0113134 A1 | 8/2002 | Laing et al. |
| 6,288,707 B1 | 9/2001 | Philipp | | 2002/0117122 A1 | 8/2002 | Lindner |
| 6,290,139 B1 | 9/2001 | Kolze | | 2002/0148040 A1 | 10/2002 | Mateina |
| 6,290,147 B1 | 9/2001 | Bertrand et al. | | 2002/0179723 A1 | 12/2002 | Wack et al. |
| 6,305,075 B1* | 10/2001 | Ersoy et al. ............... 29/829 | | 2003/0001025 A1 | 1/2003 | Quintana |
| 0,044,954 A1 | 11/2001 | DiCarlo | | 2003/0080194 A1 | 5/2003 | O'Hara et al. |
| 6,315,208 B1 | 11/2001 | Doyle | | 2003/0088338 A1 | 5/2003 | Phillips et al. |
| 6,317,717 B1 | 11/2001 | Lindsey et al. | | 2003/0089399 A1 | 5/2003 | Acker |

| | | | | | | |
|---|---|---|---|---|---|---|
| 2003/0125842 | A1 | 7/2003 | Chang et al. | EP | 0961067 B1 | 12/1999 |
| 2003/0126993 | A1 | 7/2003 | Lassota et al. | JP | 63111383 | 5/1998 |
| 2003/0185548 | A1 | 10/2003 | Novotny et al. | JP | 00073426 | 3/2000 |
| 2003/0189108 | A1 | 10/2003 | Bosio | JP | 2003-20703 A | 1/2003 |
| 2003/0201018 | A1 | 10/2003 | Bush | JP | 2003105817 | 4/2003 |
| 2003/0213062 | A1 | 11/2003 | Honda et al. | JP | 2003293411 | 10/2003 |
| 2003/0234769 | A1 | 12/2003 | Cross et al. | JP | 2004-092023 A | 3/2004 |
| 2004/0011399 | A1 | 1/2004 | Segien, Jr. | JP | 2005-146551 A | 6/2005 |
| 2004/0041033 | A1 | 3/2004 | Kemp | KR | 10-1997-0700266 | 1/1997 |
| 2004/0041034 | A1 | 3/2004 | Kemp | KR | 10-2003-0008144 | 1/2003 |
| 2004/0061685 | A1* | 4/2004 | Ostergard et al. ............. 345/169 | KR | 102003-0077823 | 10/2003 |
| 2004/0088786 | A1 | 5/2004 | Malek et al. | KR | 20-0382786 Y1 | 4/2005 |
| 2004/0135010 | A1 | 7/2004 | Malek et al. | WO | WO 91/17377 | 11/1991 |
| 2004/0149643 | A1* | 8/2004 | Vandenbelt et al. .......... 210/282 | WO | WO 01/20204 | 3/2001 |
| 2004/0155116 | A1 | 8/2004 | Wack et al. | WO | WO 2004/001142 | 12/2003 |
| 2004/0195382 | A1 | 10/2004 | Anderson et al. | WO | WO 2004/094990 | 11/2004 |
| 2004/0206405 | A1 | 10/2004 | Smith et al. | WO | WO 2005/057086 | 6/2005 |
| 2004/0212599 | A1* | 10/2004 | Cok et al. ....................... 345/173 | WO | WO 2006/136256 | 12/2006 |
| 2004/0262552 | A1 | 12/2004 | Lowe | WO | WO2007/059051 A2 | 5/2007 |
| 2005/0001046 | A1 | 1/2005 | Laing | WO | WO2007/082301 A2 | 7/2007 |
| 2005/0006402 | A1 | 1/2005 | Acker | WO | WO 2008/094247 | 8/2008 |
| 2005/0022871 | A1 | 2/2005 | Acker | WO | WO2008/094651 A1 | 8/2008 |
| 2005/0044625 | A1 | 3/2005 | Kommers | | | |
| 2005/0082503 | A1 | 4/2005 | Patterson et al. | | | |
| 2005/0086958 | A1 | 4/2005 | Walsh | | | |
| 2005/0117912 | A1 | 6/2005 | Patterson et al. | | | |
| 2005/0121529 | A1 | 6/2005 | DeLangis | | | |
| 2005/0125083 | A1 | 6/2005 | Kiko | | | |
| 2005/0127313 | A1 | 6/2005 | Watson | | | |
| 2005/0133100 | A1 | 6/2005 | Bolderheij et al. | | | |
| 2005/0146513 | A1* | 7/2005 | Hill et al. ....................... 345/173 | | | |
| 2005/0150552 | A1 | 7/2005 | Forshey | | | |
| 2005/0150556 | A1 | 7/2005 | Jonte | | | |
| 2005/0151101 | A1 | 7/2005 | McDaniel et al. | | | |
| 2005/0167625 | A1 | 8/2005 | Deen | | | |
| 2005/0194399 | A1 | 9/2005 | Proctor | | | |
| 2005/0199841 | A1 | 9/2005 | O'Maley | | | |
| 2005/0199843 | A1* | 9/2005 | Jost et al. .................. 251/129.04 | | | |
| 2005/0236594 | A1 | 10/2005 | Lilly et al. | | | |
| 2005/0273218 | A1* | 12/2005 | Breed et al. ........................ 701/2 | | | |
| 2006/0066991 | A1* | 3/2006 | Hirano et al. .............. 360/97.02 | | | |
| 2006/0101575 | A1 | 5/2006 | Louis | | | |
| 2006/0130907 | A1 | 6/2006 | Marty et al. | | | |
| 2006/0130908 | A1 | 6/2006 | Marty et al. | | | |
| 2006/0138246 | A1 | 6/2006 | Stowe et al. | | | |
| 2006/0153165 | A1 | 7/2006 | Beachy | | | |
| 2006/0186215 | A1 | 8/2006 | Logan | | | |
| 2006/0200903 | A1 | 9/2006 | Rodenbeck et al. | | | |
| 2006/0201558 | A1 | 9/2006 | Marty et al. | | | |
| 2006/0202142 | A1* | 9/2006 | Marty et al. ............. 251/129.04 | | | |
| 2006/0212016 | A1 | 9/2006 | Lavon et al. | | | |
| 2006/0231638 | A1 | 10/2006 | Belz et al. | | | |
| 2006/0231788 | A1 | 10/2006 | Cheng | | | |
| 2006/0238428 | A1* | 10/2006 | Schmitt et al. ................ 343/713 | | | |
| 2006/0238513 | A1* | 10/2006 | Philipp ........................ 345/173 | | | |
| 2006/0283511 | A1 | 12/2006 | Nelson | | | |
| 2007/0001018 | A1 | 1/2007 | Schmitt et al. | | | |
| 2007/0057215 | A1 | 3/2007 | Parsons et al. | | | |
| 2007/0069168 | A1 | 3/2007 | Jonte | | | |
| 2007/0157978 | A1 | 7/2007 | Jonte et al. | | | |
| 2007/0235672 | A1 | 10/2007 | McDaniel et al. | | | |
| 2007/0246550 | A1 | 10/2007 | Rodenbeck et al. | | | |
| 2007/0246564 | A1 | 10/2007 | Rodenbeck et al. | | | |
| 2008/0178950 | A1 | 7/2008 | Marty et al. | | | |
| 2008/0178957 | A1 | 7/2008 | Thomas et al. | | | |
| 2008/0189850 | A1 | 8/2008 | Seggio et al. | | | |
| 2008/0203195 | A1 | 8/2008 | Schmitt | | | |
| 2008/0271238 | A1 | 11/2008 | Reeder et al. | | | |
| 2009/0039176 | A1 | 2/2009 | Davidson et al. | | | |
| 2010/0012194 | A1 | 1/2010 | Jonte et al. | | | |
| 2010/0096017 | A1 | 4/2010 | Jonte et al. | | | |
| 2010/0294641 | A1 | 11/2010 | Kunkel | | | |

FOREIGN PATENT DOCUMENTS

| | | |
|---|---|---|
| DE | 3339849 | 5/1985 |
| DE | 04401637 | 5/1998 |
| DE | 19815324 | 11/2000 |

OTHER PUBLICATIONS

Symmons®, "Ultra-Sense® Sensor Faucets with Position-Sensitive Detection," © 2001-2002, 2 pgs.
Symmons®, "Ultra-Sense® Battery-Powered, Sensor-Operated Lavatory Faucet S-6080 Series," Oct. 2002, 4 pgs.
TOTO® Products, "Self-Generating EcoPower System Sensor Faucet, Standard Spout," Specification Sheet, Nov. 2002, 2 pgs.
SLOAN® Optima® i.q. Electronic Hand Washing Faucet, Apr. 2004, 2 pgs.
ZURN® Plumbing Products Group, "AquaSense® Sensor Faucet," Jun. 9, 2004, 2 pgs.
Symmons®, "Ultra-Sense® Sensor Faucets with Position-Sensitive Detection," Aug. 2004, 4 pgs.
KWC AG, Kitchen Faucet 802285 Installation and Service Instructions, dated Jul. 2005, 8 pgs.
Technical Concepts, AutoFaucet® with "Surround Sensor" Technology, Oct. 2005, 4 pgs.
Symmons® Commercial Faucets: Reliability With a Sense of Style, 1 pg.
Technical Concepts International, Inc., Capri AutoFaucet® with Surround Sensor™ Technology, 500556, 500576, 500577, (undated), 1 pg.
Symmons, Ultra-Sense, Battery-Powered Faucets with PDS and Ultra-Sense AC Powered Faucets, © 1999-2004, 2 pgs.
Symmons, Ultra-Sense, Sensor Faucet with Position-Sensitive Detection, © 2001-2002, 2 pgs.
Philipp, Hal, "Tough Touch Screen," applicanceDESIGN, Feb. 2006.
Quantum Research Group, "Gorenje Puts QSlideTM Technology into Next-Generation Kitchen Hob," Feb. 8, 2006, http://www.qprox.com/news/gorenje.php, 3 pgs.
Quantum Research Group, "Qprox™ Capacitive Touch Applications," http://www.qprox.com/background/applications.php, 8 pgs.
Quantum Research Group, "QT401 QSlide™ Touch Slider IC," 2004, 16 pgs.
Quantum Research Group, "E401 User Manual," 15 pgs.
Quantum Research Group, "QT411-ISSG QSlide™ Touch Slider IC," 2004-2005, 12 pgs.
Sequine et al., Cypress Perform, "Application Notes AN2292," Oct. 31, 2005, 15 pgs.
Sequine et al., Cypress Perform, "Application Notes AN2292a," Apr. 14, 2005, 6 pgs.
Camacho et al., Freescale Semiconductor, "Touch Pad System Using MC34940/MC33794 E-Field Sensors," Feb. 2006, 52 pgs.
Various Products (available at least before Apr. 20, 2006), 5 pgs.
Hego WaterDesign, "Touch Faucets—Amazing Futuristic Faucet Designs," Oct. 6, 2009, 3 pgs.
Sequine et al., Cypress Perform, "Application Notes AN2233a, Capacitive Switch Scan" Apr. 14, 2005, 6 pgs.

* cited by examiner

TOUCH SENSOR

CROSS REFERENCE TO RELATED APPLICATIONS

This application claims the benefit of U.S. Provisional Application Ser. No. 60/793,885, filed Apr. 20, 2006, the disclosure of which is expressly incorporated by reference herein.

BACKGROUND AND SUMMARY OF THE INVENTION

The present invention relates generally to touch sensors and more particularly to touch sensors for use with a user interface having a non-linear surface.

Capacitive touch sensors which are provided on a face of a printed circuit board are known. Further, capacitive touch sensors which are attached to a flexible strip of Mylar are known.

In an exemplary embodiment of the present invention, a touch sensor is provided. The touch sensor comprises a rigid base member including a non-linear surface, and at least two spaced apart conductors positioned along the non-linear surface. In an example, the rigid base member is a printed circuit board and the non-linear surface is an edge of the printed circuit board. In one variation the non-linear surface is curved. In another example, the at least two spaced apart conductors are connected to a controller which is configured to determine the location of a user's finger relative to the non-linear surface. In a further example, the non-linear surface has a profile which matches a profile of a cover.

In another exemplary embodiment of the present invention, a touch sensor is provided. The touch sensor comprises a rigid base member including a first side, and at least two spaced apart conductors positioned along the first side. In an example, a first one of the two spaced apart conductors is positioned proximate to a top edge of the rigid base member, and a second one of the two spaced apart conductors is positioned proximate to a bottom edge of the rigid base member.

In a further exemplary embodiment of the present invention, a touch sensor is provided. The touch sensor comprises a rigid base member including a first side, and a capacitive sensor element provided generally along the first side. In an example, the capacitive sensor includes two spaced apart conductors. In another example, the capacitive sensor is a slider sensor.

In yet another exemplary embodiment of the present invention, a touch sensor is provided. The touch sensor comprises a rigid base member including a first side, and a sensor element provided generally along the first side. In an example, the sensor element is a capacitive sensor.

In yet a further exemplary embodiment of the present invention, a water delivery system is provided. The water delivery system comprises an elongated curved spout having an internal waterway, and a user interface coupled to the spout, The user interface including a cover having a non-linear profile along a first direction, and a sensor positioned below the cover having a non-linear profile which generally matches the non-linear profile of the cover. In an example, the sensor includes a rigid base member and a capacitive sensor provided generally along a first side of the rigid base member.

Additional features and advantages of the present invention will become apparent to those skilled in the art upon consideration of the following detailed description of illustrative embodiments exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to the precise forms disclosed. Rather, the embodiments selected for description have been chosen to enable one skilled in the art to practice the invention. Although the disclosure is described as a touch sensor for use in connection with a water delivery system, it should be understood that the touch sensor may be used in various applications and should not be limited to use in connection with a water delivery system.

Figure 1:
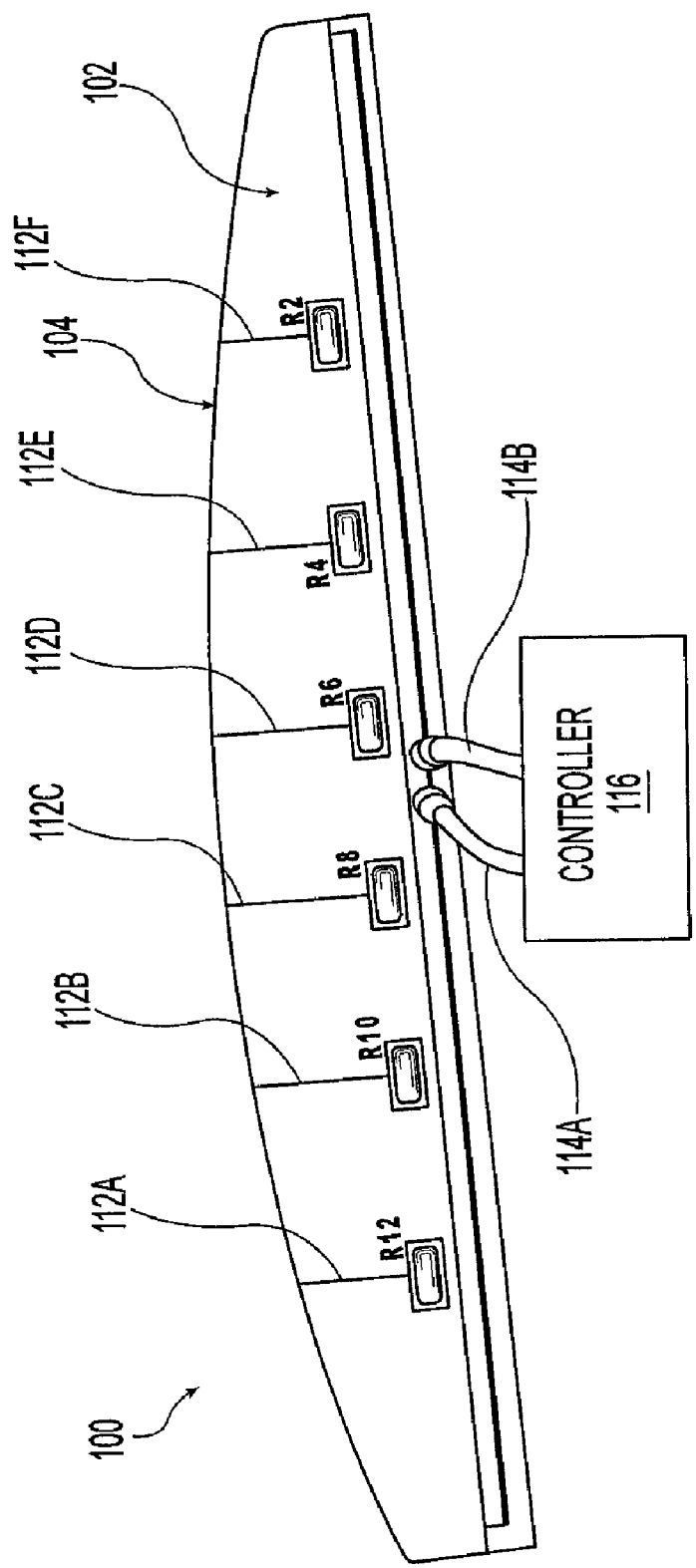
FIG. 1 is generally a side view of an exemplary touch sensor.

Referring to FIG. 1, a touch sensor 100 is shown. Sensor 100 includes a base member 102 having an edge surface or side 104. In one embodiment, base member 102 is generally rigid. In the illustrated embodiment, edge surface 104 has a non-linear profile. In another embodiment, edge surface 104 has a linear profile and/or a combination of one or more linear profile segments and one or more non-linear profile segments. As explained herein, the profile of edge surface 104 may be selected to match a profile of a cover, such as cover 200 in FIGS. 4 and 5.

Additional exemplary covers are provided in U.S. Provisional Patent Application Ser. No. 60/794,229, filed Apr. 20, 2006, titled "Electronic User Interface for Electronic Mixing of Water for Residential Faucets," listing Robert W. Rodenbeck et al. as inventors (referred to herein as "User Interface Patent Application"), the disclosure of which is expressly incorporated by reference herein. As explained in the User Interface Patent Application, touch sensors, such as touch sensor 100, are used to communicate user inputs to a controller, such as controller 120, which adjusts a valve 116 based at least in part on such user inputs.

Figure 2:
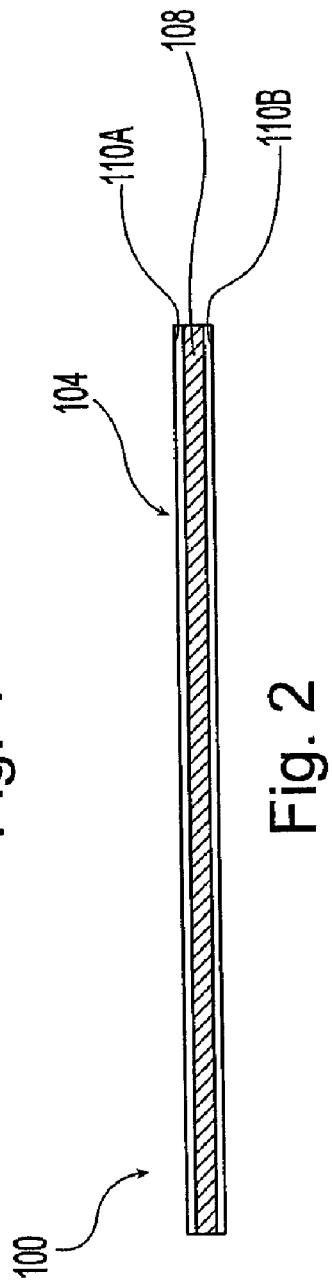
FIG. 2 is a representative top view of the touch sensor of FIG. 1.

In the illustrated embodiment, base member 102 is a printed circuit board and edge surface 104 is a side of the printed circuit board. The printed circuit board is generally rigid or stiff. Referring to FIG. 2, an exemplary representation of edge surface 104 is shown. Edge surface 104 includes a central portion 108 which is the material of the printed circuit board. Spaced apart top and bottom portions 110A and 110B are made of a conductive material, such as copper. Spaced apart portions 110A and 110B form the capacitive portion of sensor 100. Spaced apart portions are shown to coincide with a top edge and a bottom edge of edge surface 104. In one embodiment, one or both of portions 110A and 110B may be offset from the respective edge of edge surface 104.

In the illustrated embodiment, the copper of portions 110A and 110B are applied to the printed circuit board such that portions 110A and 110B are a part of edge surface 104. In another embodiment, the copper is not a part of edge surface 104, but is rather backed away from edge surface 104 by an offset amount. In one example, an offset amount of up to about five thousands of an inch. In the illustrated embodiment, edge surface 104 is the material of the printed circuit board. In other embodiments edge surface 104 may be made of other materials.

Sensor 100 includes a plurality of leads 112A-F (leads are on both sides of sensor 100) which connect with copper portions 110A and 110B. These leads are coupled through resistors to two output wires 114A and 114B. Output wires 114A and 114B are coupled to controller 116 which monitors one or more electrical characteristics, such as capacitance, between wires 114A and 114B. As a user brings his or her finger into the area of a portion of edge 104, the capacitance value between wires 114A and 114B is altered. Based on the monitored capacitance value, controller 116 is able to determine the location of a user's finger along edge surface 104. Controller 116 may detect a rapid touch of an area of edge surface 104 and/or may track the movement of a finger as it slides along edge surface 104. In one embodiment, controller 116 may distinguish between 128 various locations along edge surface 104.

In one embodiment, controller 116 is a Model No. QT401 touch slider integrated circuit available from Quantum Research Group whose North American headquarters are located at 651 Holiday Drive, Bldg. 5/300, Pittsburgh, Pa. 15220. Additional details about the QT401 are provided in Appendix A of U.S. Provisional Application Ser. No. 60/793,885, filed Apr. 20, 2006, the disclosure of which is expressly incorporated by reference herein and one or more of the following U.S. Pat. Nos. 5,730,165; 6,288,707; 6,377,009; 6,452,514; 6,457,355; 6,466,036; and 6,535,200, the disclosures of which are expressly incorporated by reference herein.

In one embodiment, controller 116 is a Model No. QT411 touch slider integrated circuit also available from Quantum Research Group. Additional details about the QT411 are provided in Appendix B of U.S. Provisional Application Ser. No. 60/793,885, filed Apr. 20, 2006, the disclosure of which is expressly incorporated by reference herein and one or more of the following U.S. Pat. Nos. 5,730,165; 6,288,707; 6,377,009; 6,452,514; 6,457,355; 6,466,036; and 6,535,200, the disclosures of which are expressly incorporated by reference herein.

In one embodiment, controller 116 utilizes PSoC™ CapSense™ technology available from Cypress Semiconductor located at 198 Champion Ct., San Jose, Calif. 95134. Additional details about the PSoC™ CapSense™ technology are provided in Appendix C of U.S. Provisional Application Ser. No. 60/793,885, filed Apr. 20, 2006, the disclosure of which is expressly incorporated by reference herein. In another embodiment, controller 116 utilizes E-Field technology available from Freescale Semiconductor having its Technical Information Center located at Technical Information Center CH 370, 1300 N. Alma School Road, Chandler, Ariz. 85224. Additional details about the E-Field technology are provided in Appendix D of U.S. Provisional Application Ser. No. 60/793,885, filed Apr. 20, 2006, the disclosure of which is expressly incorporated by reference herein.

Additional layouts of conductive portions are provided in the various Appendices A-D of U.S. Provisional Application Ser. No. 60/793,885, filed Apr. 20, 2006, the disclosure of which is expressly incorporated by reference herein. The additional layouts may be used on edge surface 104 of base member 102.

Figure 3:
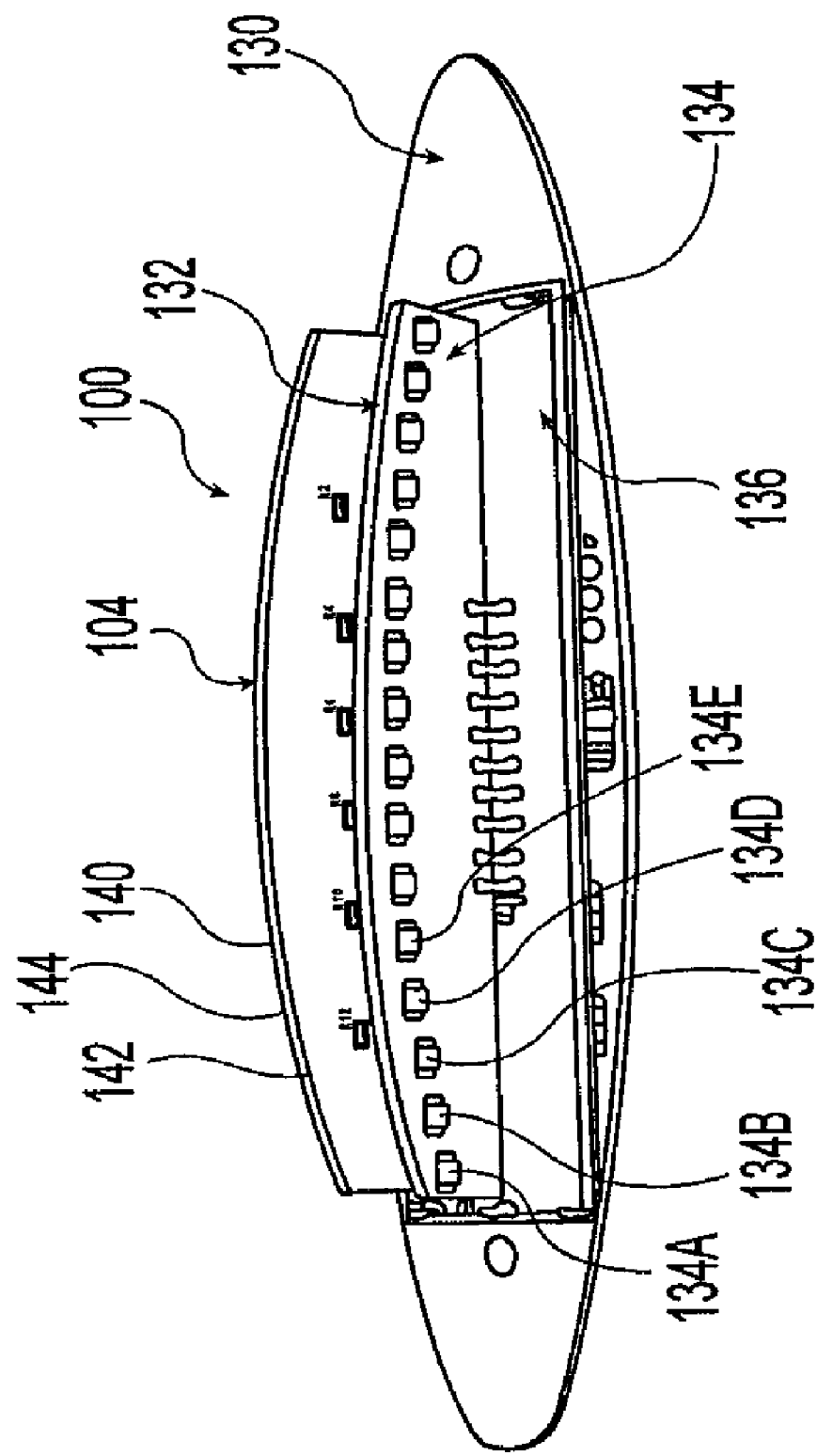
FIG. 3 is a perspective view of the touch sensor of FIG. 1 coupled to a controller board whereto an output display is also coupled.

Referring to FIG. 3, sensor 100 is shown coupled to a second circuit board 130 which includes controller 116. Second circuit board 130 is further coupled to a third circuit board 132 having a plurality of indicator devices 134, illustratively light emitting diodes. Indicator devices 134 are located on both sides of third circuit board 132. The indicator devices 134 visible in FIG. 3 are electronically coupled to a second sensor 100 (not shown) which is coupled to second circuit board 130 generally in area 136 while the indicator devices 134 on the backside of third circuit board 132 are electronically coupled to sensor 100.

In one embodiment, indicator devices 134 indicate a selected parameter of sensor 100. For instance, assuming the visible indicators 134 were electronically coupled to sensor 100 for the sake of illustration, if a user touches or slides their finger to a location 140 on edge surface 104 then the corresponding first five indicators 134A-E would illuminate to indicate the current selected parameter. In contrast, had the user touched or slid their finger to location 142 then only the corresponding first three indicators 134A-C would illuminate to indicate the current selected parameter. Assuming the user initially touches location 140 and slides their finger to location 142 then initially the first five indicators 134A-E would be lit, then the first four 134A-D (corresponding to location 144), and finally then the first three indicators 134A-C corresponding to location 142. In one embodiment, sensor 100 is used to control the temperature of water provided by a water delivery system and the second sensor 100 (not shown) is used to control the flow rate of water provided by the water delivery system. Details regarding the control of temperature and flow rate of water are found in the User Interface Patent Application which has been incorporated by reference herein.

In one embodiment, indicator devices 134 indicate a current value of the a parameter controlled by the input to sensor 100. For example, assuming sensor 100 corresponds to water temperature, only the first indicator 134A may be lit to indicate that the current water temperature is cold. The user touches location 140 to request a warmer temperature of water. As the water temperature rises, second indicator 134B becomes lit, followed by indicators 134C-E in succession.

Figure 4:
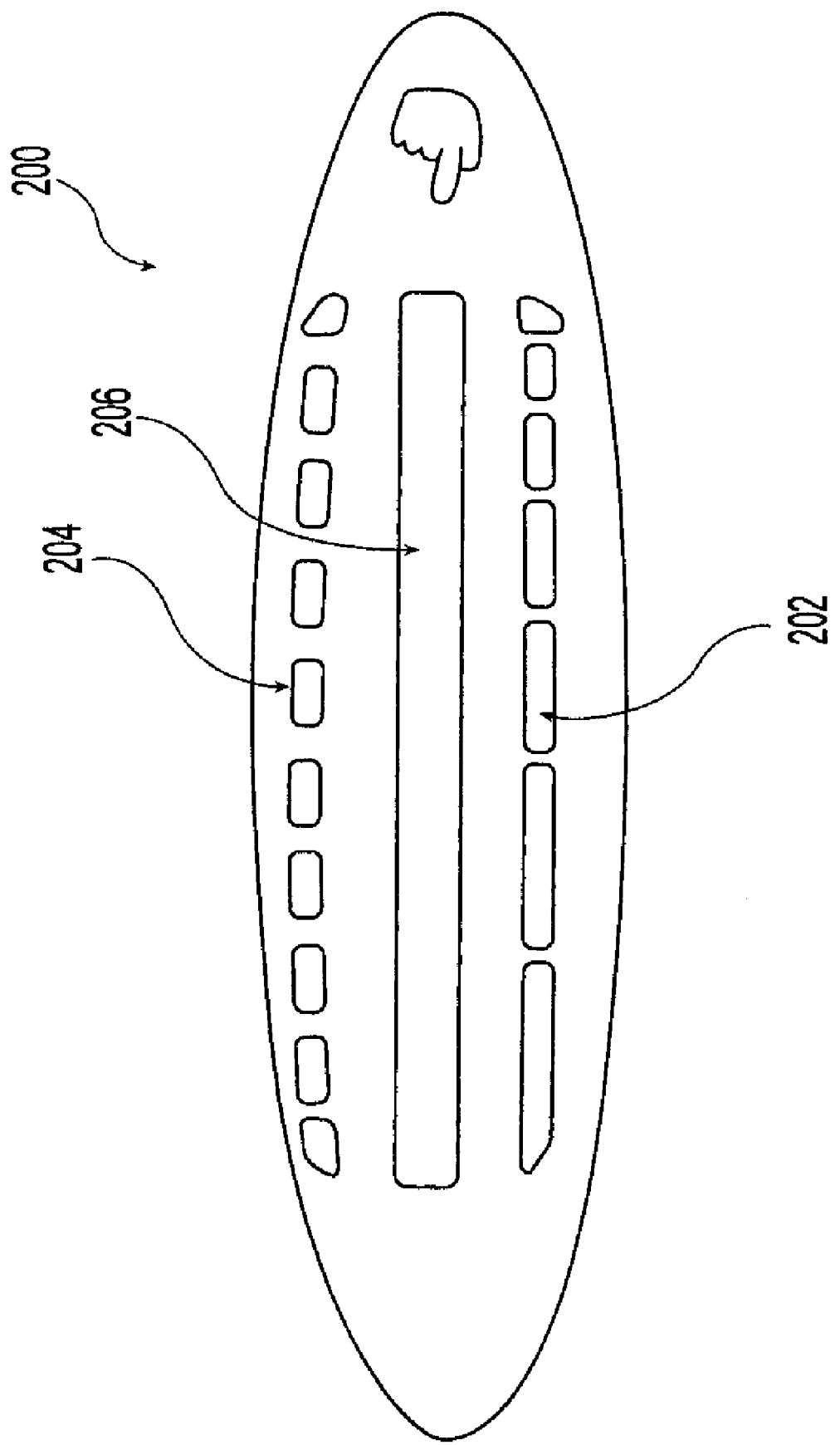
FIG. 4 is a top view of an exemplary user interface for use with the touch sensor of FIG. 1.
Figure 5:
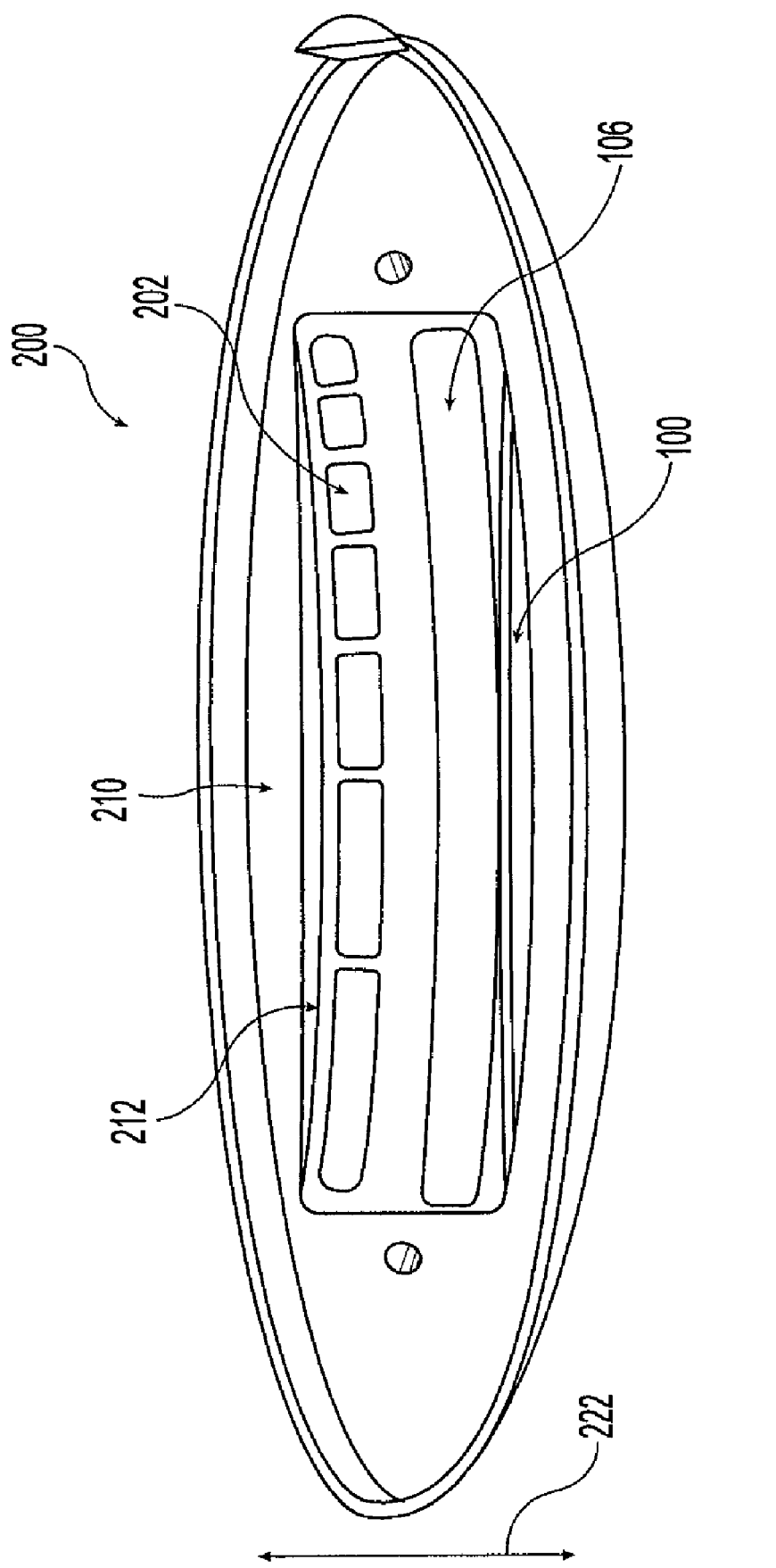
FIG. 5 is a generally bottom view of the exemplary user interface of FIG. 4 with the touch sensor of FIG. 1 placed in a holder.

Referring to FIGS. 4 and 5, a cover 200 is shown for attachment to a spout (not shown) of a water delivery device. Cover 200 corresponds to the interface that a user touches to provide input to sensor 100 and second sensor 100 (not shown). Referring to FIG. 4, cover 200 includes a first indicia 202 which generally is positioned above second sensor 100 (not shown) and corresponds to the flow rate of water. Cover 200 further includes a second indicia 204 which generally is positioned above sensor 100 and corresponds to the temperature of water. Cover 200 further includes a window 206 which permits the light generated by indicator devices 134 to be visible from an exterior of cover 200.

Referring to FIG. 5, cover 200 includes a recess 210 that corresponds generally to the region of indicia 202 and 204 and window 206 on the exterior of cover 200. Cover 200 includes holders 212 in recess 210 which receive the respective edge surface 104 of each sensor 100. In one embodiment, a wall thickness from recess 210 to the exterior of cover 200 is generally constant. In one example, the wall thickness is about 0.005 inches. In one embodiment, cover 200 is made of a polymeric material, such as plastic, which has been injection molded.

Further, the profile of edge surface 104 of sensor 100 is selected to generally match the profile of cover 200 along direction 220. As such, assuming edge 104 is generally flush the interior wall of recess 210 the user may bring their finger within about 0.005 inches of the respective edge surface 104 of each sensor 100 regardless of their position along the respective indicia 202 and 204.

As generally shown in FIGS. 4 and 5, cover 200 has a non-linear profile in both directions 220 and 222. In one embodiment, due to the thickness of base member 102, the curvature in direction 222 is generally negligible and the profile of edge surface 104 is contoured to match the profile of cover 200 in direction 220. In one embodiment, the profile of edge surface 104 is contoured to match the profile of cover 200 in both direction 220 and 222.

In one embodiment, sensor 100 generally focuses its field vertically out of edge 104. As such, when sensor 100 is implemented in connection with a spout (not shown) that is made of metal, such as chrome, the effect of the metal is minimized due to the field being generally isolated above cover 200.

In one embodiment, wherein cover 200 has a non-linear profile in one of directions 220 and 222 and a linear or generally liner profile in the other of directions 220 and 222, sensor 100 may be replaced with a flexible sensor (not shown). An example of a flexible sensor is a flexible polymeric material, such as a polyester film (Mylar), substrate having an adhesive. Using the adhesive, the substrate may be attached to an inside of cover 200 (holders 212 are not included). On the opposite side of the substrate copper is etched on to form the capacitive element of the sensor. The capacitive element is coupled to controller 116 like sensor 100.

The entire disclosure of the User Interface Patent Application is expressly incorporated by reference herein to provide additional details about exemplary water delivery systems.

Although the invention has been described in detail with reference to certain preferred embodiments, variations and modifications exist within the spirit and scope of the invention as described and defined in the following claims.

The invention claimed is:

1. A touch sensor, comprising:
a rigid base member including opposing top and bottom surfaces, and a non-linear edge surface; and
at least two spaced apart conductors positioned along the non-linear edge surface, at least one conductor positioned proximate the top surface of the base member, and at least one conductor positioned proximate the bottom surface of the base member.

2. A touch sensor, comprising a rigid base member including a top side, a bottom side, and a first side having a top edge in common with the top side and a bottom edge in common with the bottom side; and
a capacitive sensor including at least two spaced apart conductors positioned along the first side, wherein a first one of the two spaced apart conductors is positioned proximate to the top edge of the rigid base member along the first side and a second one of the two spaced apart conductors is positioned proximate to the bottom edge of the rigid base member along the first side.

3. A water delivery system, comprising a spout having an internal waterway;
a user interface coupled to the spout, the user interface including:
a cover having a non-linear profile along a first direction;
a sensor including:
a rigid base member including a top side, a bottom side, and a first side having a first edge in common with the top side and a second edge in common with the bottom side; and
at least two spaced apart conductors provided generally along the first side of the base member proximate the cover, the first side of the base member having a non-linear profile which matches the non-linear profile of the cover.

4. The water delivery system of claim 3, wherein the sensor comprises a capacitive sensor.

5. The water delivery system of claim 4, wherein the capacitive sensor is a slider sensor.

6. A touch sensor, comprising
a rigid base member including a first side, the rigid base member being a printed circuit board and the first side being an edge surface of the printed circuit board positioned between a top side of the printed circuit board and a bottom side of the printed circuit board; and
a sensor element provided generally along the first side.

7. The touch sensor of claim 6, wherein the sensor element is a slide sensor.

8. A water delivery system, comprising:
a spout having an internal waterway;
a user interface coupled to the spout, the user interface including
a cover having a non-linear profile along a first direction;
a sensor positioned below the cover having a non-linear profile which matches the non-linear profile of the cover, wherein the sensor includes a rigid base member and a capacitive sensor provided generally along a first side of the rigid base member, the rigid base member having a non-linear profile which matches the non-linear profile of the cover.

9. The water delivery system of claim 8, wherein the sensor further includes a controller coupled to the capacitive sensor.

10. The water delivery system of claim 9, further comprising a valve in fluid communication with the internal waterway of the spout and in fluid communication with at least one source of water, the valve regulating a flow rate of the water communicated to the spout from the at least one source of water, wherein a flow rate is specified by the controller based on the capacitive sensor.

11. The water delivery system of claim 10, wherein the at least one source of water includes a source of hot water and a source of cold water, the valve regulating a temperature of the water communicated to the spout and the flow rate of the water communicated to the spout.

12. The water delivery system, of claim 11, further comprising a second sensor, wherein the controller specifies a temperature based on the second sensor.

13. The water delivery system of claim 8, wherein the sensor includes a flexible strip having an adhesive on a first side and the capacitive sensor on a second side.

14. The water delivery system of claim 8, wherein the rigid base member includes a top side and a bottom side, the first side having a top edge in common with the top side and a bottom edge in common with the bottom side.

15. The water delivery system of claim 14, wherein the capacitive sensor includes at least two spaced apart conductors positioned along the first side.

16. The water delivery system of claim 15, wherein a first one of the at least two spaced apart conductors is positioned proximate to the top edge of the rigid base member along the first side and a second one of the two spaced apart conductors is positioned proximate to the bottom edge of the rigid base member along the first side.

17. The water delivery system of claim 15, wherein a first one of the at least two spaced apart conductors coincide with the top edge of the first side and a second one of the at least two spaced apart conductors coincide with the bottom edge of the first side.

18. The water delivery system of claim 15, wherein a first one of the at least two spaced apart conductors is offset from the top edge of the first side and a second one of the at least two spaced apart conductors is offset from the bottom edge of the first side.

19. The water delivery system of claim 18, wherein the first one of the at least two spaced apart conductors and the second one of the at least two spaced apart conductors are provided on the first side.

20. The water delivery system of claim 18, wherein the first one of the at least two spaced apart conductors and the second one of the at least two spaced apart conductors span an entire length of the first side.

21. The water delivery system of claim 8, wherein the sensor monitors through the cover a region on an exterior of the cover.

22. The water delivery system of claim 21, wherein the capacitive sensor is within about 0.005 inches of the exterior of the cover.

23. The water delivery system of claim 8, wherein the capacitive sensor focuses its field out of the first side.

24. The water delivery system of claim 8, wherein a field of the capacitive sensor being is generally isolated above the cover.

25. The water delivery system of claim 8, wherein the rigid base member is a printed circuit board and the first side is a non-linear edge surface of the printed circuit board positioned between a top side of the printed circuit board and a bottom side of the printed circuit board.

26. The water delivery system of claim 8, wherein the non-linear profile of the cover is curved.

27. The water delivery system of claim 8, wherein the controller is configured to determine the location of a user's finger relative to the non-linear profile of the cover.

* * * * *

UNITED STATES PATENT AND TRADEMARK OFFICE
CERTIFICATE OF CORRECTION

PATENT NO. : 8,089,473 B2  Page 1 of 1
APPLICATION NO. : 11/734499
DATED : January 3, 2012
INVENTOR(S) : Paul D. Koottungal It is certified that error appears in the above-identified patent and that said Letters Patent is hereby corrected as shown below:

In claim 24, at col. 8, line 4, delete "being."

Signed and Sealed this
Thirteenth Day of March, 2012

David J. Kappos
*Director of the United States Patent and Trademark Office*